United States Patent [19]

Tsuboi et al.

[11] 4,121,198

[45] Oct. 17, 1978

[54] REMOTE CONTROL SYSTEM

[75] Inventors: Yoshikazu Tsuboi, Takatsuki; Yoshitomo Uzu, Suita, both of Japan

[73] Assignee: Matsushita Electric Industrial Co., Ltd., Kadoma, Japan

[21] Appl. No.: 747,988

[22] Filed: Dec. 6, 1976

[30] Foreign Application Priority Data

| Dec. 17, 1975 | [JP] | Japan | 50-151024 |
| Dec. 29, 1975 | [JP] | Japan | 50-158817 |
| Jan. 20, 1976 | [JP] | Japan | 51-5618 |
| Feb. 13, 1976 | [JP] | Japan | 51-15022 |

[51] Int. Cl.² ............... H04Q 9/10; H04B 1/06
[52] U.S. Cl. ................. 340/171 R; 343/225; 325/392
[58] Field of Search ........ 340/171 R, 171 A, 171 PF, 340/148, 168 R; 325/30, 37, 392; 343/228, 225

[56] References Cited

U.S. PATENT DOCUMENTS

| 3,823,385 | 7/1974 | Kitamura | 340/171 R |
| 3,859,475 | 1/1975 | Wulfsberg et al. | 340/168 R |
| 3,973,241 | 8/1976 | Streckenbach et al. | 340/171 A |
| 4,005,428 | 1/1977 | Graham | 343/228 |
| 4,015,082 | 3/1977 | Matty et al. | 340/171 PF |
| 4,024,474 | 5/1977 | Beckmann | 325/37 |

Primary Examiner—Donald J. Yusko
Attorney, Agent, or Firm—Cushman, Darby & Cushman

[57] ABSTRACT

In a remote control system, a transmitted signal comprising several bursts of $f_1$ Hz arranged by coding input signal and other several bursts of $f_2$ Hz inserted in spaces between said $f_1$ Hz bursts is sent from a transmitter to a receiver which decodes the transmitted signal to produce a control signal without error even in the presence of noise.

7 Claims, 12 Drawing Figures

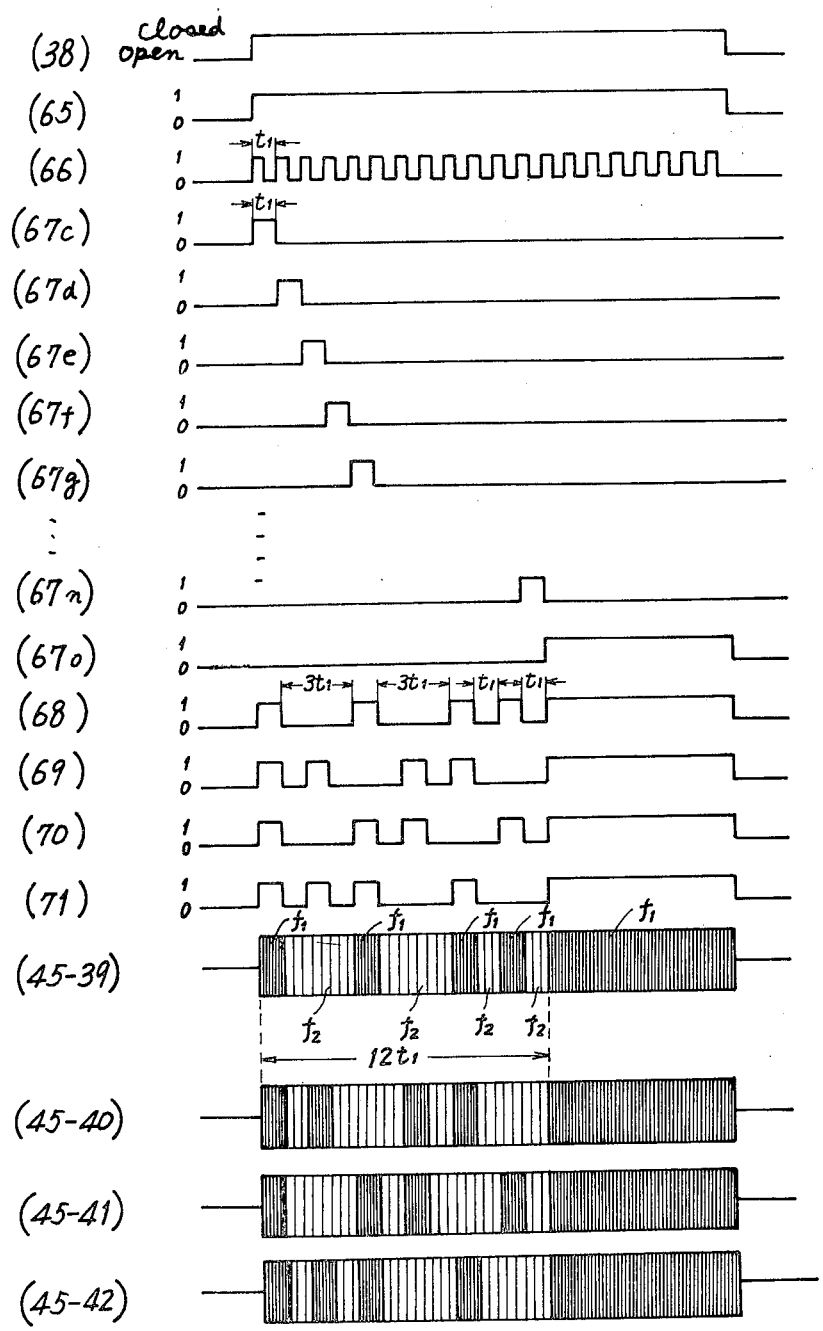

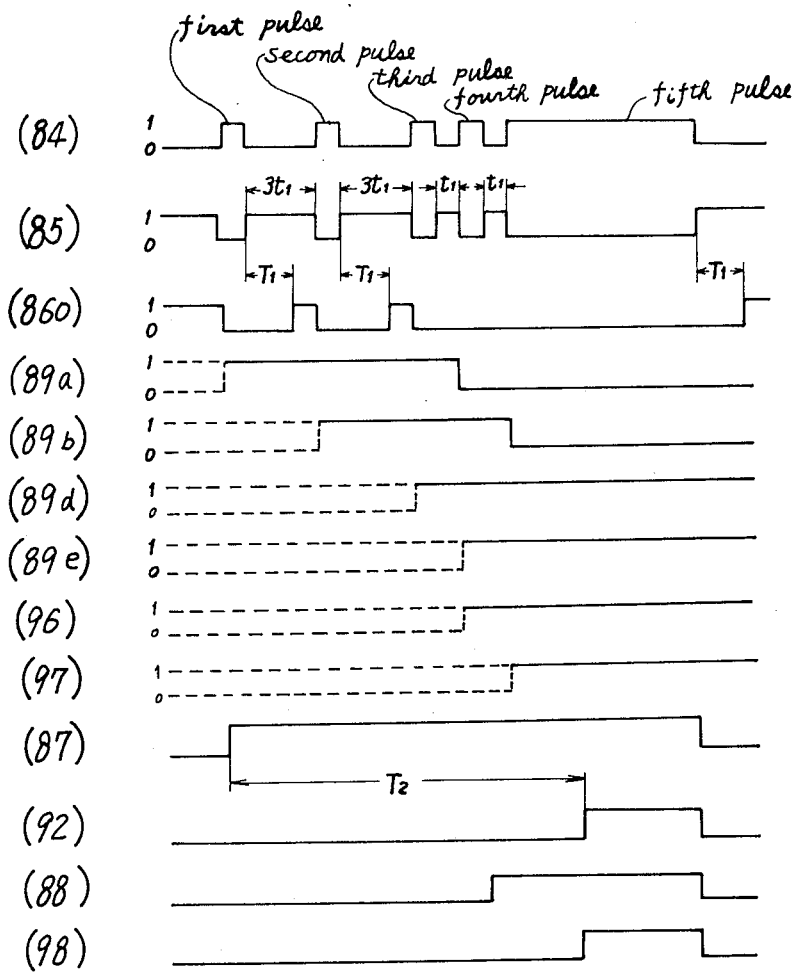

4,121,198

REMOTE CONTROL SYSTEM

BACKGROUND OF THE INVENTION

Hitherto, many systems of remote controlling which employ bursts of single frequency wave, the number of bursts being preset, are known. For instance, a transmitter comprises buttons for operating switches for causing the transmitter to transmit various kinds of train of ultrasonic waves from its speaker to a receiver. In a widely used example, by pressing a first button, a first kind of train consisting of two bursts of ultrasonic wave is produced, by pressing a second button, a second kind of train consisting of three bursts of ultrasonic wave is produced, and so on. In the receiver, upon receiving abovementioned various kinds of the ultrasonic wave bursts, by decoding the wave bursts to develop to a count, several kinds of outputs are obtainable at its several output terminals. Accordingly, corresponding to the buttons of the transmitter, several kinds of controls, for instance, ON-OFF of power switch, channel selection and sound-volume control can be made.

In another conventional system, a little more sophisticated mechanism has been devised. Namely, binary-coding is utilized for several control items, and according to the binary-coding, a pulse code modulation is made in arranging the bursts of the ultrasonic waves of a single frequency.

However, the abovementioned remote control systems utilizing ultrasonic waves of a single frequency are likely to be disrupted by external ultrasonic noises from rattling of a bunch of keys, telephone bell, etc., or by fluorescent lamp light in case of light transmission system. Namely, when such noises containing components of the ultrasonic signal or the light used and the noises continue for a specified period to be detected by the decoder in the receiver, then the components of the noises form spurious pulse and are erroneously detected in the receiver, thereby causing the counter to malfunction.

SUMMARY OF THE INVENTION

This invention purports to provide a novel remote control system capable of making selected control from a remote place without malfunction even in the presence of noise.

Another object of the present invention is to provide a remote control system capable of retaining a selected control from a remote place for a desired time period.

BRIEF EXPLANATION OF THE DRAWING

FIG. 1 to FIG. 4 are for Example 1 of the present invention wherein
FIG. 1 is a block diagram of a transmitter,
FIG. 2 is a wave form chart showing wave forms of various parts of the transmitter of FIG. 1,
FIG. 3 is a block diagram of a receiver,
FIG. 4 is wave form chart showing various parts of the receiver of FIG. 3,
FIG. 5 to FIG. 8 are for Example 2 of the present invention wherein
FIG. 8 is a graph showing characteristic curve of a receiver to be used with the transmitter of FIG. 5, FIG. 9 to FIG. 12 are for Example 3 of the present invention wherein
FIG. 11 and FIG. 12 are wave form charts of various parts of the transmitter and the receiver of FIGS. 9 and 10, respectively.

DETAILED DESCRIPTION OF THE INVENTION

In the remote control system of the present invention, a signal which is transmitted from a transmitter to a receiver comprises several parts or bursts of a first frequency ($f_1$ Hz) which is arranged according to specified codes and other several parts or bursts of a second frequency ($f_2$ Hz) inserted in spaces between the parts of the first frequency. The abovementioned codes are predetermined corresponding to various items of controlling, for instance, switch on, switch off, channel selector rotation, sound volume controlling, etc.

Example 1: In the transmitter 10 of FIG. 1, the clock pulse generator 10 generates a pulse train shown by FIG. 2(10) having a preset period (for instance 10 m sec) at its output terminal "a" when its terminal "b" is in "0" state, and the clock pulse is stopped when the terminal "b" is in "1" state.

Figure 2:
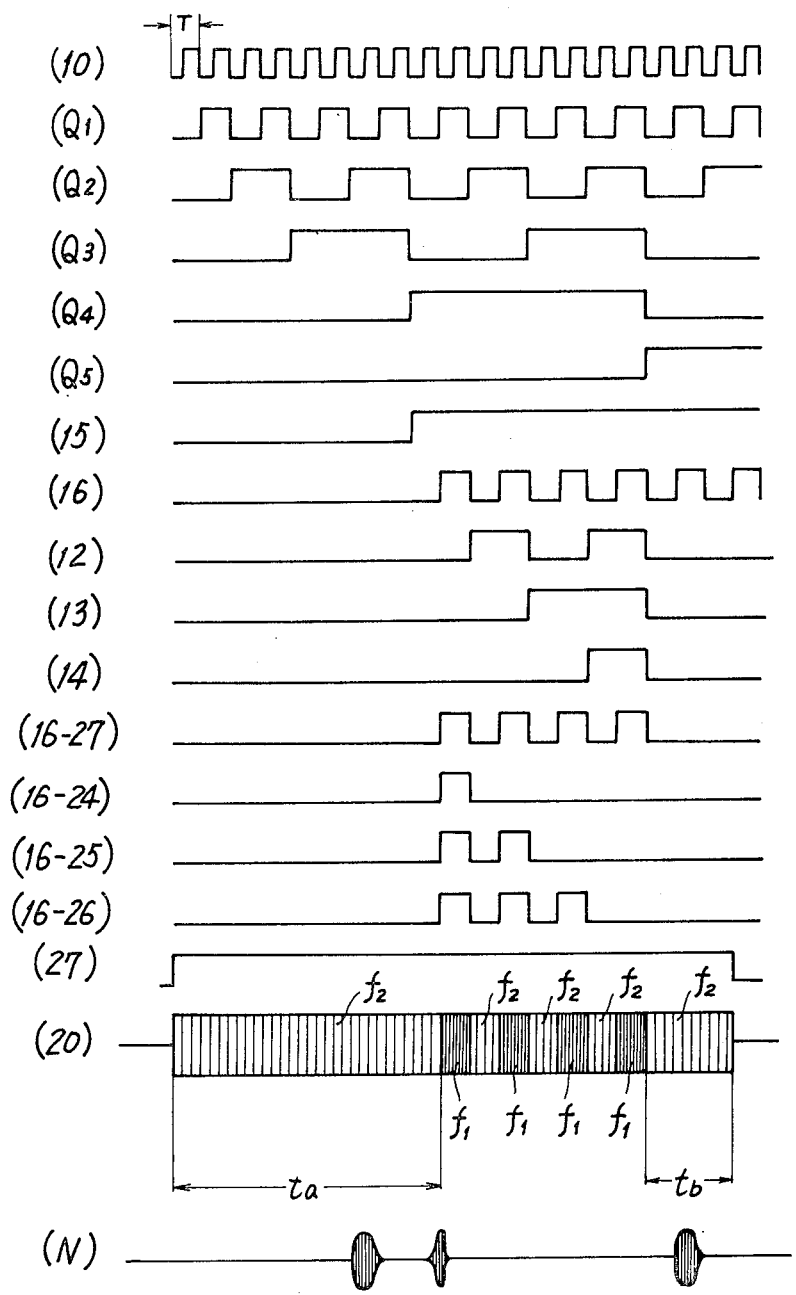

The clock pulse from the terminal "a" is given to the input terminal of a binary counter 11, which thereby produces outputs Q1, Q2, Q3, Q4 and Q5 shown in FIG. 2(11) at its output terminals Q1, Q2, Q3, Q4 and Q5. When a reset input terminal R receives signal "1", all of the output terminals Q1, Q2, Q3, Q4 and Q5 become "0" regardless of the input signal.

The output terminals Q2 and Q4 are connected to input terminals of AND gate 12, the output terminals Q3 and Q4 are connected to input terminals of AND gate 13, the output terminals Q2, Q3 and Q4 are connected to input terminals of AND gate 14, and the output terminals Q4 and Q5 are connected to input terminals of an OR gate 15. The output terminal Q1 and output terminal of the OR gate 15 are connected to the input terminal of an AND gate 16. Output terminals of the AND gates 12, 13 and 14 and the output terminal Q5 are connected to the input terminal "b" of the clock pulse generator 10 through respective contacts of the selection switches 24, 25, 26 and 27, respectively. The selection switches 24 to 27 are constituted so as to be OFF in normal state and only one of them can be made ON at the same time. Output terminal of the AND gate 16 is connected through a resistor 17 to the base of a transistor 18. The emitter of the transistor 18 is grounded and the collector thereof is connected through a capacitor 19 to the controlling input terminal "b" of an oscillator 20. A diode 21 is connected across the collector and the emitter of the transistor 18 as a discharging pass for the capacitor 19. The input terminal "a" of the oscillator 20 is connected to a contact "a" of a switch 28, and a contact "b" of the switch 28 is connected to the resetting terminal R of the binary counter 11. A moving contact "c" of the switch 28 is connected to one end of a battery 22 or a D.C. voltage source, and the other end of the battery 22 or the D.C. source is grounded.

The oscillator 20 oscillates when its input terminal "a" is "1". The frequency of the oscillation is $f_1$ when the transistor 18 is in ON state thereby grounding one end of the capacitor 19, and is $f_2$ when the transistor 18 is in OFF state thereby disconnecting the capacitor from the ground. The switch 28 is mechanically linked to the selection switches 24 to 27 in a manner that the switch 28 is closed on the side of the contact "a" when any one of the selection switches 24 to 27 is closed. A transmitting transducer 23 such as a ceramic speaker or a light emitting diode is connected to the output terminal of the oscillator 20.

Figure 1:
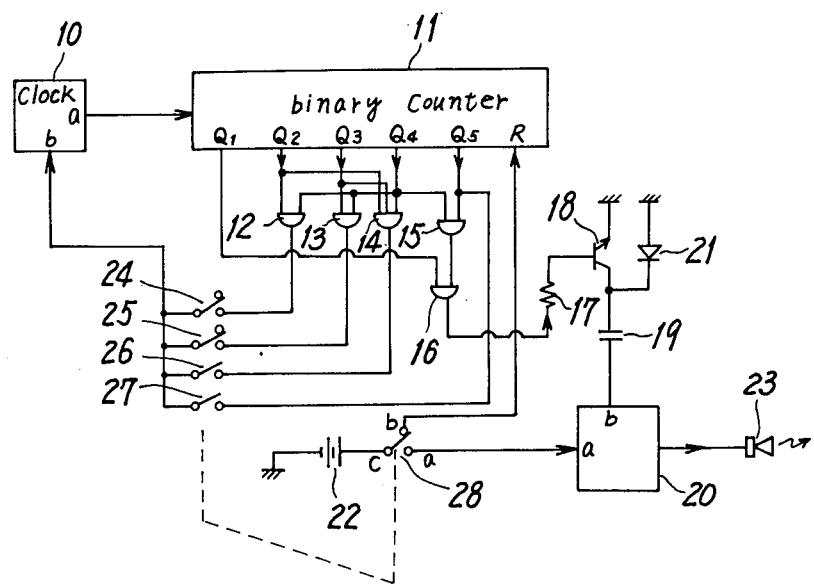

The operation and working of the transmitter of FIG. 1 is elucidated below referring to wave form chart of FIG. 2.

By means of clock pulse from the clock pulse generator 10, the binary counter 11 produces output pulses as shown by the wave forms (Q1), (Q2), (Q3), (Q4) and (Q5) of FIG. 2, and accordingly, the AND gates 12, 13 and 14 and the OR gate 15 produce output pulses as shown by the wave forms (12), (13), (14) and (15) of FIG. 2. Accordingly, the AND gate 16 produces the output pulses as shown by waveform (F) of FIG. 2.

Then a case where one of selection switches, for instance, switch 27 is selectively closed, is elucidated. By closing the switch 27, because of the abovementioned linkage, the switch 28 is changed over to the side of its contact "a", and therefore, the oscillator 20 starts to oscillate. At the beginning, the output from the output terminal Q5 is "0" thereby making the input terminal "b" of the clock pulse generator 20 "0", and therefore the clock pulse generator 20 starts to produce the clock pulses. Also at the beginning, the output of the AND gate 16 is "0", resulting in making the transistor 18 OFF, and accordingly the frequency of the oscillation is $f_2$. When, after a lapse of a specified period (i.e., after a predetermined number of clock pulses), the output from the terminal Q5 becomes "1", this output is impressed through the then closed switch 27 to the controlling terminal "b", and therefore, the clock pulse generator 10 stops its oscillation. Resultantly, the AND gate 16 gives four pulses to the base of the transistor 18 as shown by the wave form (16-27) of FIG. 2, during the abovementioned period of oscillation of the clock pulse generator 10.

In the similar way, if the selection switch 24, 25 or 26 is selectively closed, the output of the AND gate 16 is as shown by the wave form (16-24), (16-25) or (16-26) of FIG. 2. By means of the four pulses from the AND gate 16, the oscillator 20 produces four bursts of wave in the $f_1$ frequency, and in balance periods the frequency is $f_2$, as shown in FIG. 2(20).

Therefore, by closing the selection switch 27 for the period as shown by FIG. 2(27), the oscillation outputs as shown by FIG. 2(20) is produced by the oscillator 20, and is transduced into ultrasonic wave or electromagnetic wave by the transducer 23.

Figure 3:
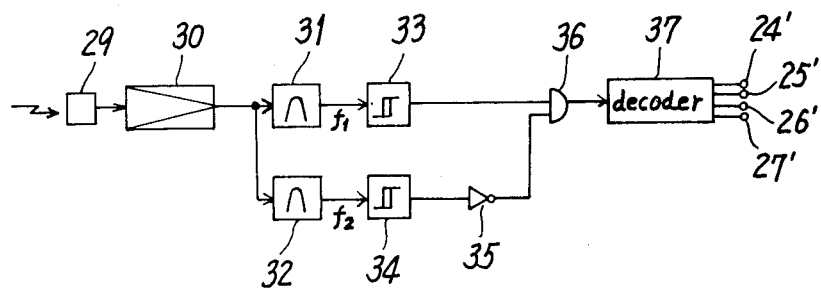

A receiver of Example 1 is shown in FIG. 3. A receiving transducer 29 transduces transmitted signal, for instance, the ultrasonic wave or the electromagnetic wave from the transmitting transducer 23, into electric signal. The electric signal is amplified by an amplifier and, treated by turning and detecting circuits 31 and 32 for the frequency components of $f_1$ and $f_2$ and is impressed to the wave form shaping circuit 33 and 34, respectively. The output pulse of the wave form shaping circuit 33 is given to the AND gate 36 and the output pulse of the waveform shaping circuit 33 is given, through an inverter 35, to the AND gate 36. The output of the AND gate 36 is given to a known decoder 37 which produces four kinds of outputs which correspond to the selection by closing the abovementioned four selection switches 24, 25, 26 and 27.

Figure 4:
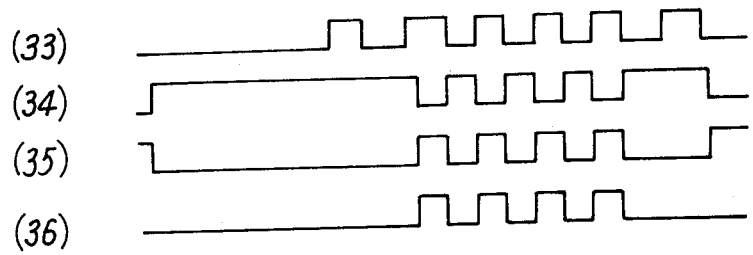

Now, provided that the transmitted signal of FIG. 2(20) and noises of FIG. 2(N) are received by the transducer 29, then the output of the wave form shaping circuit is as shown by the wave form of FIG. 4(33). In this wave form of FIG. 4(33), a pair of pulses in the extreme left and in the extreme right are spurious pulses originated by the noises, and also the pulse width of the second pulse (which is corresponding to the first $f_1$ burst of the transmitted signal) is unduly broadened by the noise. Though the output signal of the wave form shaping circuit 33 shown by FIG. 4(33) has spurious contents originated from the noises, the spurious contents are eliminated from the resultant wave form shown by FIG. 4(36) of the AND gate 36 by means of processing of the output utilizing the output (shown by FIG. 4(34)) of the other wave form shaping circuit 34. Namely, faithful reproduction of the output of the AND gate 16 (shown by FIG. 2(16)) is obtainable. FIG. 4(35) shows the output of the inverter 35. Thus, a desired output which is not influenced by the noise is obtainable from the decoder 37.

As a conclusion, by insertion of the second frequency ($f_2$) parts in the spaces between the first frequency ($f_1$) parts and before and after the same, it is possible to eliminate the adverse effect of the noise superposed on the received signal.

Example 2: In this example, short bursts of second frequency $f_2$ are provided immediately after each bursts of a first frequency $f_1$ arranged under a controlling code. The second frequency bursts serve to shorten adverse tailing of transducer outputs thereby improving accuracies of signal transmission and control.

Figure 5:
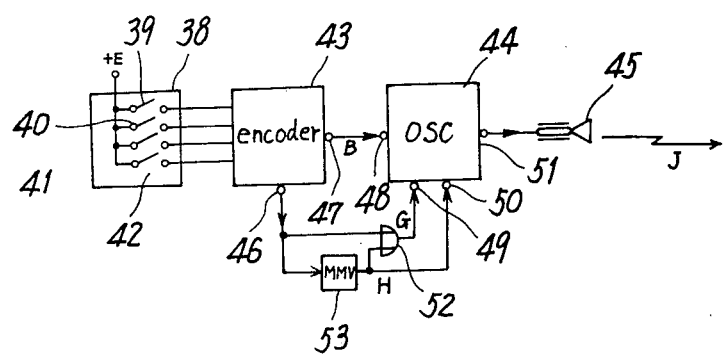
FIG. 5 is a block diagram of a transmitter.
Figure 6:
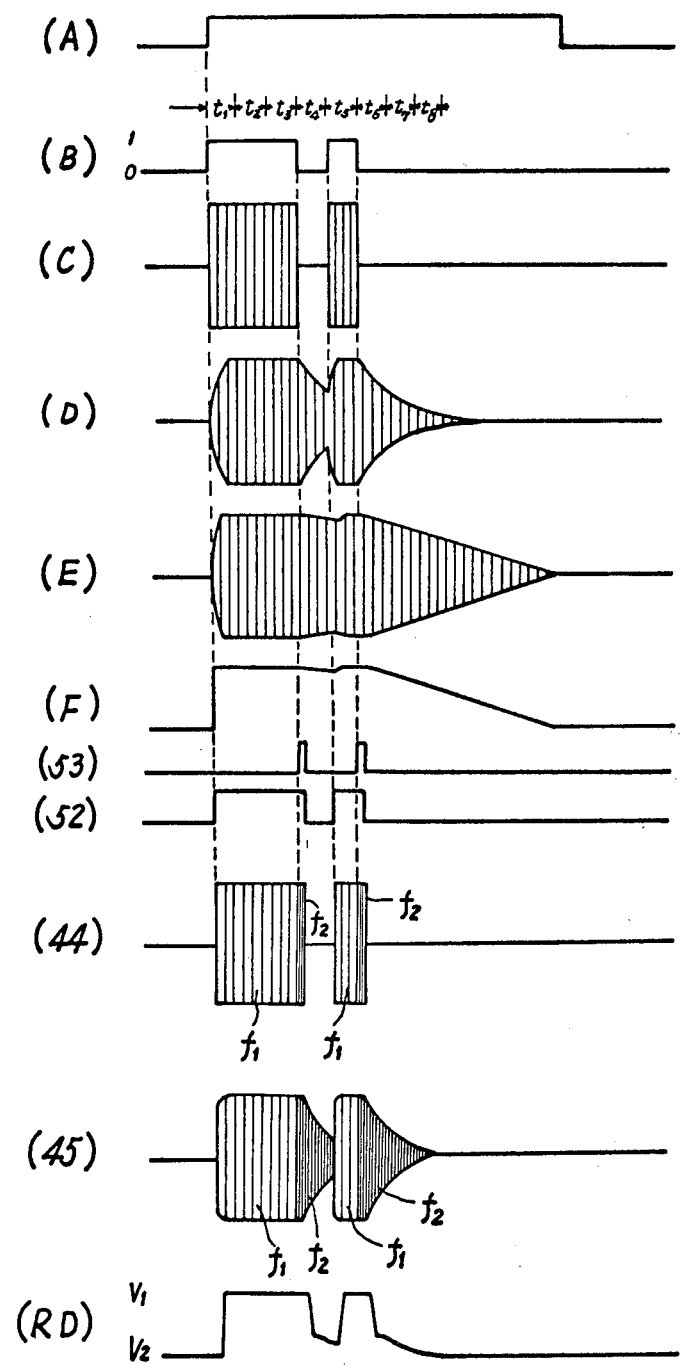
FIG. 6 is a wave form chart showing wave forms of various parts of the receiver of FIG. 5.
Figure 7:
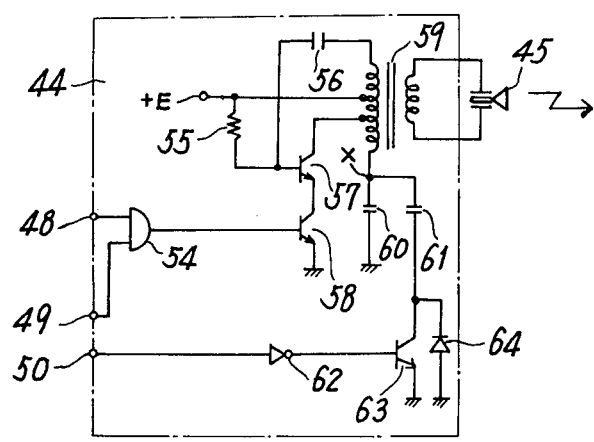
FIG. 7 is a detailed circuit diagram of an oscillator of the transmitter of FIG. 5.
Figure 8:
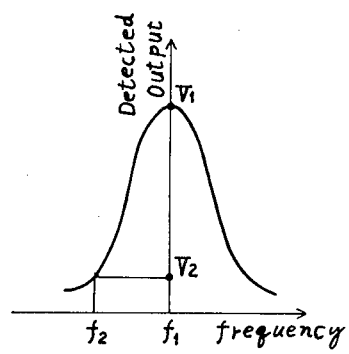

This example is elucidated referring to FIG. 5 showing an embodiment constitution of a transmitter, FIG. 6 showing wave forms of various parts, FIG. 7 showing a of an oscillator in the transmitter and FIG. 8 showing characteristic curve of the detector of a receiver of this Example.

In the conventional remote control system, the control signal consists of several bursts of a single frequency $f_1$ as shown in FIG. 6(C). Such control signal is made by controlling an oscillator or a gate by a pulse train of FIG. 6(B). When such signal of single frequency is given to an ultrasonic transmitting transducer, for instance, ceramic transducer of resonance type, then owing to the nature of such transducer, the ultrasonic output rises up in a considerably short time at each front end of the bursts of $f_1$ wave while the ultrasonic output has a long tailing i.e., very slow attenuation part at each tail end of the bursts as shown by FIG. 6(D). In case the remote control system is for controlling a TV receiver and in case the transmitting transducer 45 is so close as, for instance, 0.5m to the receiving transducer, then the output of the receiving transducer (as shown in FIG. 6(E)) fails to have space part to correspond to the space part ($t_4$) existing between pulses in the original pulse train of FIG. 6(B). Therefore, the signal produced by detection of the signal of FIG. 6(E) fails to have space part therein. Thus, there has been a considerable possibility of making erroneous control by losing necessary spaces in and after the bursts of the controlling signal. In order to overcome such shortcoming with the conventional single frequency remote control system, it would be necessary to provide such long space period as 1 second instead of widely used several milliseconds.

In this Example 2, the abovementioned shortcoming is eliminated by utilizing a second frequency bursts immediately after each burst of $f_1$ frequency to shorten the trailings of the ultrasonic output from the transmitting transducer.

FIG. 5 shows a transmitter of this example wherein, a selection means 38 comprises selection switches 39, 40, 41 and 42, either one of which is selectively closed at one time and sends selection signal to an encoder 43. The encoder 43 produces several kinds of pulse trains 43 shown by FIG. 6(B) corresponding to the input signal from the selection means 38. The encoder 43 is constituted to continuously issue a signal "1" from its output terminal 47 during the while either one of the selection switches 39 to 42 is closed. This "1" signal is given to the terminal 48 of the oscillator 44. The encoder 43 sends out encoded pulse train (for example, as shown by FIG. 6(B)), corresponding to the selected closing of a selection switch, from the output terminal 46 to one input terminal of an OR gate and to the input terminal of a monostable multivibrator 53, which upon each falling-down of the pulses from the terminal 46 produces each one pulse as shown by FIG. 6(53) at its output terminal. The output terminal of the monostable multivibrator 53 is connected to the other input terminal of the OR gate 52, and also to a frequency control terminal 50 of the oscillator 44. The oscillator 44 is constituted so as to oscillate when both input terminals 48 and 49 are made simultaneously "1", and to oscillate in frequencies $f_1$ and $f_2$ for signals "0" and "1" at the frequency control terminal 50, respectively.

The operation of the transmitter of FIG. 5 is elucidated. Provided that the switch 41 is selectively closed, then during the retention of the closing, "1" signal is given from the output terminal 47 of the encoder 43 to the input terminal 48 of the oscillator. Also by means of closing of the switch 41, a binary-coded pulse shown by FIG. 6(B) is given from the output terminal 46 through the OR gate 52 to the input terminal 49. Since the input terminals 48 and 49 of the oscillator 44 receive signals and the input terminal 50 does not receive a signal, the oscillator 44 oscillates in the frequency of $f_2$ during the period of "1" state of the output from the terminal 45 of the encoder. Namely, the oscillation continues during the $t_1+t_2+t_3$ period and the $t_5$ period. This oscillation in $f_1$ frequency ceases during the $t_4$ period, since the input terminal 49 is "0". Upon each fall-down of the pulses from the output terminal 46 of the encoder 43, the monostable multivibrator 53 generates one pulse as shown by FIG. 6(53). The output pulse of the monostable multivibrator 53 is given through the OR gate 52 (as shown by FIG. 6(52)) to the input terminal 49 and to the input terminal 50, thereby making both terminals 48 and 49 "1". Accordingly, the oscillator 44 oscillates in $f_2$ frequency for a specified period defined by the width of the pulse of the monostable multivibrator 53, immediately following the oscillation in the $f_1$ frequency (as shown by FIG. 6(44)). When the output of this two-frequency oscillator 44 is impressed to the ceramic transducer 45 of resonant type, the ultrasonic output is issued as shown by FIG. 6(45). Namely, after each burst of ultrasonic outputs of the frequency $f_1$, the ultrasonic output of the other frequency $f_2$ follows, and therefore, the tailing part is not of $f_1$ frequency but is of $f_2$ frequency. Furthermore, when the second $f_1$ frequency signal is fed to the transducer 45, the tailing part of $f_2$ frequency instantly stops and the ultrasonic output from the transducer 45 is immediately changed into $f_1$ frequency. Namely, the $f_2$ frequency bursts are provided for the sake of eliminating or suppressing the tailing output of $f_1$ frequency, and therefore serves to prevent malfunction of the controlling system. By closing a switch 39, 40, 41 or 42 in the selection means, a specifiedly arranged $f_1$ and subsequent $f_2$ frequency bursts corresponding to the selected switch are transmitted. Therefore, several controlling, for instance, switching ON or OFF, channel selection, sound volume controlling, etc., can be made. In actual embodiment, for example, $f_1$ is 41.5 KHz and $f_2$ is 38.5 KHz. In place of the abovementioned OR gate 52, a NOR gate may be used if the oscillator 44 is designed to work with a NOR output.

One actual example of the oscillator 44 is shown in FIG. 7. The output terminal 47 of the aforementioned encoder 43 is connected, through the input terminal 48, to one input terminal of the AND gate 54, and output terminal of the OR gate 52 is connected, through the input terminal 49, to the other input terminal of the AND gate 54. The output terminal of the AND gate 54 is connected to the base of a switching transistor 58, which is connected to switch the emitter circuit of the oscillating transistor 57. The output terminal of the monostable multivibrator 53 is connected, through the input terminal 50 and the inverter 62, to the base of a transistor 63. The transistor 57 together with a resistor 55, capacitors 56 and 60 and a transformer 59 constitute known Hartley's oscillator which oscillate at the frequency of $$f_1 = 1/2\pi\sqrt{L_{59}C_{60}},$$

wherein $L_{59}$ and $C_{60}$ are inductance and capacitance of the transformer 59 and the capacitor 60.

Furthermore, an additional capacitor 61 is connected with its one end to the connection point X between the primary coil of transformer 59 and the capacitor 60, and with the other end thereof, through the collector and emitter circuit of the switching transistor 63, to the ground. The switching transistor 63 is made "ON" when its base receives "1" signal, thereby connecting the additional capacitor 61 in parallel with the capacitor 60. Accordingly, when the base of the transistor 63 receives "1" signal, the oscillation frequency is $$f_2 = \frac{1}{2\pi\sqrt{L_{59}(C_{60}+C_{61})}},$$

wherein $C_{61}$ is capacitance of the capacitor 61. A diode 64 is provided as a discharging path of the capacitor 61. The transmitting transducer 45 is connected to the secondary coil of the transformer 59. A terminal +E is connected to a positive terminal of a D.C. power source (not shown in the drawing).

For receiving the transmitted control signal shown by FIG. 6(45), a receiver having a tuner which is tuned in the $f_1$ frequency is used. FIG. 8 shows one example of the tuning characteristic of the tuner, wherein abscissa indicates frequency and the ordinate indicates detection output of the tuner. As shown in FIG. 8, the detection output $V_1$ for $f_1$ frequency is sufficiently larger than that $V_2$ for $f_2$ frequency, and therefore, the detection output as shown by FIG. 6(RD) is obtainable. Such output is further shaped through a known wave form shaping circuit so as to obtain accurate pulse train consisting of "1" and "0" signals to be given to an encoder. Thus, even if the remote control is made with an excessive distance between the transmitter and the receiver, an accurate control is obtainable. Thus the second frequency bursts (portions) of $f_2$ frequency serve to suppress or eliminate adverse tailing from the genuine signal of the first $f_1$ frequency. By means of the insertion of the second frequency, the spaces $t_4 t_6$ ... in the control signal arrangement can be made so short as, for instance, 5 milli-seconds without losing reliability of the remote controlling. Therefore, the controlling is made easily within a short time.

Example 3: Which embodies PCM system in transmitting control signal is elucidated hereunder referring to FIGS. 9 to 12, wherein FIG. 9 shows transmitter, FIG. 10 shows receiver, FIG. 11 shows wave forms in the transmitter and FIG. 12 shows wave forms in the receiver.

In this Example 3, by means of PCM control signal, selections of controlling can be made, and furthermore, each controlling can be retained for a desired period by, for instance, continuing to press the selected button.

Figure 9:
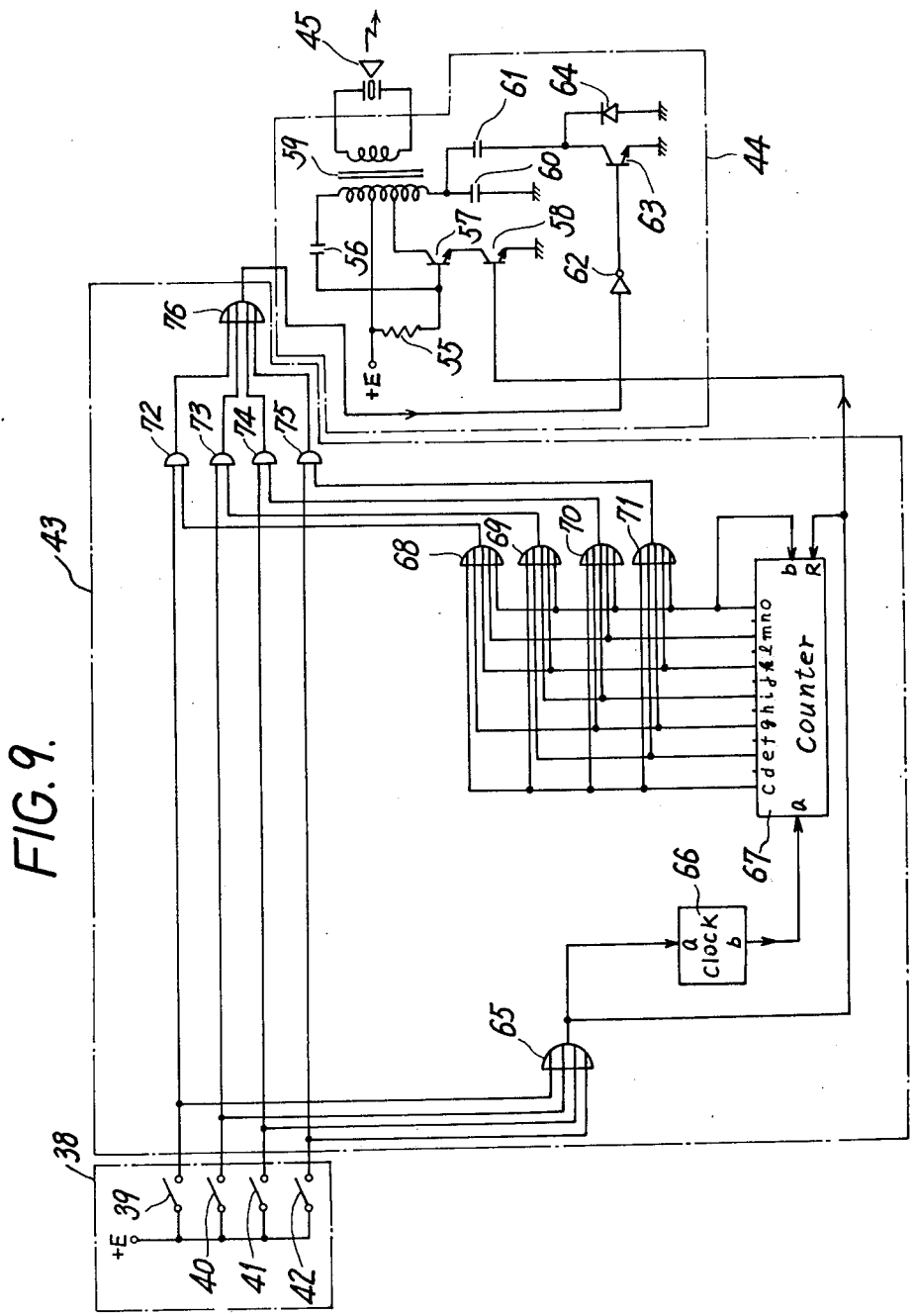
FIG. 9 is a block diagram of a transmitter.
Figure 10:
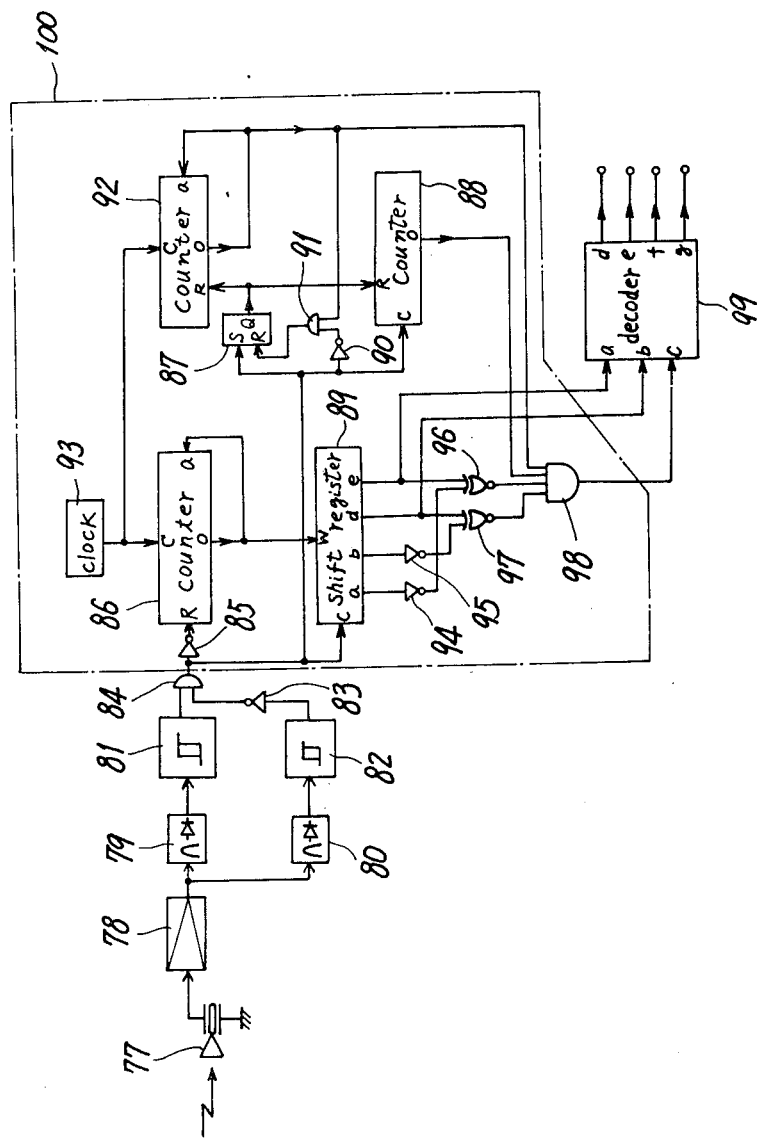
FIG. 10 is a block diagram of a receiver.

In the transmitter of FIG. 9, a selection means 38 comprises several selection switches 39, 40, 41 and 42, which are constituted in a manner that any of them can be closed at the same time. These switches are connected between common positive source terminal +E and input terminals of AND gates 72, 73, 74 and 75, respectively. The switches are connected also to the input terminals of an OR gate 65. The output terminal of the OR gate 65 is connected to the input terminal of a clock pulse generator 66, which gives clock pulses to a counter 67. The output terminals $c, e, g, i, k, m$ and $o$ are connected to the OR gates 68, 69, 70 and 71 to form a logic gate matrix together with AND gates 72, 73, 74 and 75. The last terminal $o$ is connected to the count-stopping terminal "$b$" of the counter 67 and the output terminal of the OR gate 65 is connected to the reset terminal "R" of the counter 67. In the logic gate matrix, the connections are as follows: The output terminals $c, g, k, m$ and $o$ of the counter 67 are connected to the input terminal of the OR gate 68. The output terminals $c, e, i, k$ and $o$ of the counter 67 are connected to the input terminal of the OR gate 69. The output terminals $c, g, i, m$ and $o$ of the counter 67 are connected to the input terminal of the OR gate 70. The output terminals $c, e, g, k$ and $o$ of the counter 67 are connected to the input terminal of the OR gate 71. Then, the output terminals of the OR gates 68, 69, 70 and 71 are connected to the other input terminals of AND gates 72, 73, 74 and 75, respectively. The output terminals of the AND gates 72, 73, 74 and 75 are connected to input terminals of the OR gate 76. Thus, the OR gates 65, 68 to 71 and 76, AND gates 72 to 75, the clock pulse generator 66 and the counter 67 constitute an encoder for producing specified pulse trains corresponding to the selection of the switches 39 to 42.

The output terminal of the OR gate 76 is connected, through an inverter 62, to the base of a transistor 63. The output terminal of the OR gate 65 is connected to the base of a switching transistor 58, which is connected to switch the emitter circuit of the oscillating transistor 57. The transistor 57 together with a resistor 55, capacitors 56 and 60 and a transformer 59 constitute known Hartley's oscillation circuit which oscillate at the frequency of $$f_1 = 1/2\pi\sqrt{L_{59} C_{60}},$$

wherein $L_{59}$ and $C_{60}$ are inductance and capacitance of the transformer 59 and the capacitor 60, respectively.

Furthermore, an additional capacitor 61 is connected with its one end to the connection point X between the primary coil of transformer 59 and the capacitor 60 and with the other end thereof, through the collector and emitter circuit of the switching transistor 63, to the ground. The switching transistor 63 is made "ON" when its base receives "1" signal, thereby connecting the additional capacitor 61 in parallel with the capacitor 60. Accordingly, when the base of the transistor 63 receives "1" signal, the oscillation frequency is $$f_2 = \frac{1}{2\pi\sqrt{L_{59}(C_{60}+C_{61})}},$$

wherein $C_{61}$ is capacitance of the capacitor 61. A diode 64 is provided as a discharging path of the capacitor 61. The transmitting transducer 45 is connected to the secondary coil of the transformer 59. A terminal +E is connected to a positive terminal of a D.C. power source (not shown in the Drawing).

In case an infrared controlling signal is employed, an infrared transducer, for instance, a light emitting diode is connected across the secondary coil of the transformer 59.

Next, a receiver for receiving the controlling signal from the transmitter of FIG. 9 is elucidated referring to FIG. 10. In the receiver, a receiving transducer 77, for instance, an ultrasonic microphone or an infrared photoelectric cell 77 is provided so as to give its output, through an amplifier 78, to a pair of tuning-detectors 79 and 80 for the $f_1$ frequency component and $f_2$ frequency component of the transmitted controlling signal, respectively. The detected outputs of the tuning-detector 79 and 80 are given to the wave form shaping circuit 81 and 82, respectively. The output terminals of the wave form shaping circuits 81 and 82 are connected to one input terminal of the AND gate 84 and, through an inverter 83, to the other input terminal of the AND gate 84. The output terminal of the AND gate 84 is connected, through an inverter 85, to the resetting terminal "R" of a counter 86. The output terminal of the AND gate 84 is further connected to an input terminal "$c$" of a shift resistor 89, to setting terminal "S" of an R-S flipflop circuit 87, to an input terminal "$c$" of a counter 88 and also, through an inverter 90, to an input terminal of an AND gate 91. Output terminal of a clock pulse generator 93 is connected to clock pulse terminals "$c$", "$c$" of the counters 86 and 92. The output terminal "$o$" of the counter 86 is connected to the stopping terminal "$a$" of the counter 86 itself and to the write-in terminal "$w$" of the shift register 89. The shift register 89 is of four-bit serial-in parallel-out type, and has four output terminals "$a, b, d$ and $e$". The output terminal "$a$" and "$b$" of the shift register are connected, through an inverter 94 and 95, to input terminals of Ex-NOR gates 96 and 97, respectively. The output terminals "$d$" and "$e$" of the shift register 89 are connected to the other input terminals of the Ex-NOR gates 97 and 96, respectively. The output terminal "$o$" of the counter 92 is connected to the count-stopping terminal "$a$" of the counter 92 itself. Output terminal of the AND gate 91 is connected to the reset terminal R of the R-S flipflop circuit 87. Output terminals of Ex-NOR gates 96 and 97 and output terminals "$o$", "$o$" of the counters 88 and 92 are connected to four input terminals of the AND gates 98. Output terminals "$d$" and "$e$" of the shift register 89 are further connected to input terminals "$a$" and "$b$" of a decoder 99, and the output terminal of the AND gate 98 is connected to decode starting terminal "c" of the decoder 99.

The counter 86 is constituted so as to be reset when its resetting terminal "R" is "0", count when its resetting terminal "R" is "1" and send an output "1" to its output terminal "o" after a specified time $T_1$ (shown in wave form of FIG. 12(86o)) from a count starting and retain the "1" output until the resetting terminal "R" is made "0".

The R-S flip flop circuit 87 is set to issue "1" signal from its output terminal upon receipt of "1" signal at the set terminal S and is reset to issue "0" signal from its output terminal upon receipt of "1" signal at the reset terminal R.

The counter 92 is reset when receiving "0" signal at its resetting terminal "R", counts when the resetting terminal "R" is receiving "1" and issues "1" signal from its output terminal "o" after lapse of time $T_2$ (shown in wave form of FIG. 12(87)) from the start of counting. When the output terminal "o" becomes "1", the count stopping terminal "a" receives "1" signal, and accordingly, the counter 92 stops counting retaining the "1" signal at the output terminal "o" until being reset.

The counter 88 is reset when receiving "0" signal at its resetting terminal "R", thereby issuing "0" signal from its output terminal "o", counts the number of times when the clock pulse terminal "c" is changed from "1" to "0" and issues "1" signal from the output terminal "o" when four times of the changes have been counted.

The Ex-NOR gates 96 and 97 issue "1" signal from its output terminal when both input signals are the same and issue "0" signal when both input signals are different from each other.

The decoder 99 decodes the input signals received at input terminals "a" and "b" in binary way to issue output signals "1" from its output terminals, d, e, f and g when its input terminal "c" is "1", but issues "0" signal when the input terminal "c" is "0". The relation between input signals received at the input terminals, "a", "b" and "c" and the output signals from the output terminals "d", "e", "f" and "g" of the decoder 99 is shown in the below mentioned Table 1.

Table 1

| Relation between input signals and output signals of decoder 99 | | | | | | |
|---|---|---|---|---|---|---|
| Input terminals | | | Output terminals | | | |
| a | b | c | d | e | f | g |
| 1 | 1 | 1 | 1 | 0 | 0 | 0 |
| 0 | 1 | 1 | 0 | 1 | 0 | 0 |
| 1 | 0 | 1 | 0 | 0 | 1 | 0 |
| 0 | 0 | 1 | 0 | 0 | 0 | 1 |
| 1 or 0 | 1 or 0 | 0 | 0 | 0 | 0 | 0 |

As aforementioned referring to FIG. 10, the part encircled by a block 100 constitute a pulse processing circuit.

Operation of Example 3 is as follows:

In the transmitter of FIG. 9, one of the selection switches, for instance the selection switch 39 is closed. The wave forms of various circuit parts are shown in FIG. 11. In each wave forms, the ground level and the source voltage level are indicated as "0" and "1". The switch is closed as shown by FIG. 11(38), and hence the output of the OR gate 65 is as shown by FIG. 11(65). Accordingly, the clock pulse generator 66 issues clock pulses during the closing of the selection switch 38 as shown by FIG. 11(66). By receiving the clock pulse at the input terminal "a", the known counter 67 issues the outputs of (67c), (67d), (67e), (67f), (67g), . . . (67n) and (67o) of FIG. 11 from the output terminals c, d, e, f, g . . . . n and o, respectively, each of which outputs have phases in turn different by $t_1$. Since the output of FIG. 11(o) from the output terminal "o" of the counter 67 is given to the stopping terminal "b", the counter 67 stops counting when the terminal "b" becomes "1" and its output terminal "o" retains "1" signal thereafter. When all of the selection switches 39 to 42 are open, then the reset terminal "R" of the counter 67 is "0", and hence the output terminals "c" to "o" are made "0" with priority. Upon impressing of signal "1" to the reset terminal "R", the counter 67 starts to count.

The output signals of the OR gates 68, 69, 70 and 71 are shown by (68), (69), (70) and (71) of FIG. 11. Since the switch 39 only is closed, the AND gate 72 only issues "1" signal and other AND gates 73, 74 and 75 issues "0" signal. Therefore, the output of the AND gate 72 and OR gate 76 becomes identical with the output of the OR gate 68 which is shown by FIG. 11(68).

When the selection switch 40, 41, or 42 are closed, the output of the OR gate 76 becomes as shown by (69), (70) or (71) of FIG. 11.

When "1" signal is impressed to the base of the transistor 58, the oscillator 44 oscillates.

When "1" signal is impressed to the base of the transistor 63, the capacitor 61 is connected in parallel with the capacitor 60, and hence the oscillation frequency becomes $$f_2 = \frac{1}{2\pi \sqrt{L_{59}(C_{60} + C_{61})}}.$$

When "0" signal is impressed to the base of the transistor 63, the capacitor 61 is disconnected from the capacitor 60 thereby making the oscillation frequency into $f_1 \times 1/2\pi\sqrt{L_{59}C_{60}}$.

In one actual example, $f_1$ and $f_2$ are 41.5 KH$_2$ and 38.5 KH$_2$, respectively.

The transmitted controlling signal from the transducer 45 for the selected closing of the switch 39, 40, 41 or 42 are as shown by (45-39), (45-40), (45-41) or (45-42) of FIG. 11, respectively.

As shown by the wave forms of (45-39), (45-40), (45-41) and (45-42) of FIG. 11, the transmitted control signal consists of PCM encoded "selection signal" part (for the period of $12t_1$, in the example) and subsequent "retention signal" part of $f_1$ frequency.

The below mentioned Table 2 shows one example of the relation between closing of the selection switch 39, 40, 41 or 42 and code of arrangement of the $f_1$ bursts (portions) and $f_2$ bursts (portions).

Table 2

| Data of the coding of controlling signal in the transmitter | | | | |
|---|---|---|---|---|
| Selectively closed | Data | | Inverted Data | |
| switch | A | B | B | A |
| switch 39 | 1 | 1 | 0 | 0 |
| switch 40 | 0 | 1 | 0 | 1 |
| switch 41 | 1 | 0 | 1 | 0 |
| switch 42 | 0 | 0 | 1 | 1 |

"0" means that each period of $f_2$ inserted between neighboring $f_1$ part is $t_1$.
"1" means that each period of $f_2$ inserted between neighboring $f_1$ part is $3t_1$.

The encoded signal consists of four bit data, namely A, B, $\overline{B}$ and $\overline{A}$, wherein $\overline{B}$ and $\overline{A}$ are inverted data of B and A, respectively, and are provided for the sake of preventing error in decoding. The necessary controlling information is encoded in the first two bits A and B, and in decoding this four bit coded A, B, $\overline{B}$ and $\overline{A}$ signal in the receiver, the data in the bits of $\overline{B}$ and $\overline{A}$ are used to confirm the reality of detected data in the bits of A and B by comparing the detected data of A and B with the inverted detected data of $\overline{A}$ and $\overline{B}$, respectively.

In the example of Table 2, the periods of the data 1 and 0 are selected as $3t_1$ and $t_1$, namely 3:1, but any other ratio may be used instead.

In the receiver of FIG. 10, transducer 77 transduces the controlling signal (shown by FIG. 11(45-39)) from the transmitter into electric signal and the amplifier 78 amplifies it and gives the signal to the tuning-detector 79 and 80, which selectively takes out signals based on $f_1$ frequency and $f_2$ frequency, respectively. By making logic AND signal of the detected and shaped signal of $f_1$ part and the detected, shaped and inverted signal of $f_2$ bursts, the AND gate 84 accurately produces a detected pulse train shown by FIG. 12(84), which corresponds to the original signal shown by FIG. 11(68) in the transmitter. The output of the AND gate 84 is inverted by the inverter 85 as shown by FIG. 11(85) and is impressed to the resetting terminal "R" of the counter 86. Since the counter 86 is constituted so as to count when input to the resetting terminal "R" is "1", the counter 86 counts the time period when the $f_1$ frequency portion is "0". Therefore, as can be seen from a comparison of FIG. 12(85) and FIG. 11(68), the counter 86 receives a signal with the first space period ($3t_1$) between the first pulse and the second pulse and the second space period ($3t_1$) between the second pulse and the third pulse. Incidentally, the space periods between the third and fourth pulses and fourth and fifth pulses are both $t_1$. The time $T_1$ within which a counting in the counter 86 is to be made is designed as $3t_1 > T_1 > t_1$, and the output of the counter 86 becomes as shown by FIG. 12(86o).

The shift register 89 writes therein the input data from the input terminal "w" when the clock terminal "c" becomes from "0" to "1". Accordingly, in the shift register 89, at positive going transition of the first pulse, "1" is written in, at positive going transition of the second pulse, "1" is written in, at positive going transition of the third pulse, "1" is written in, at positive going transition of the fourth pulse, "0" is written in, and at positive going transition of the fifth pulse, "0" is written in. The resultant outputs at the output terminals "a", "b", "d" and "e" of the shift register 89 are as shown by the wave forms of (89a), (89b), (89d) and (89e) of FIG. 12. In these wave forms, dotted line parts are determined by previous data. After the positive going transition of the fifth pulse, the outputs at the output terminals "a", "b", "d" and "e" are "0", "0", "1" and "1" as seen from the abovementioned wave forms.

These outputs of the shift register 89 are then processed by logic gate matrix formed by the inverters 94 and 95, Ex-NOR gates 96 and 97 and AND gate 98. The output of the logic gate matrix are given to the input terminals "a", "b" and "c" of the decoder. During the receiving of the first to fourth pulses at data input terminal "w" of the shift register 89, both input terminals of the Ex-NOR gates 96 and 97 receive "1", "1" signal, and hence the Ex-NOR gates 96 and 97 send out "1", "1" signals to the AND gate 98, as shown by (96) and (97) of FIG. 12.

When the first pulse goes high, the R-S flipflop circuit 87 is set and hence the resetting terminal R of the counter 92 receives "1" signal thereby making the counter 92 to start counting. When the time period of $T_2$ shown in FIG. 12(87) lapsed from the starting, the output terminal of the counter 92 becomes "1". The time period $T_2$ is selected to be $T_2 > 12t_1$ so that the time period $T_2$ contains first to fifth pulses. Therefore, when the fifth pulse goes low, output of the AND gate 91 becomes "1", thereby resetting the R-S flipflop circuit 87 as shown by FIG. 12(87), making its output terminal Q "0". Accordingly, when the fifth pulse goes low, the output "o" of the counter 92 becomes "0" as shown by FIG. 12(92).

Counter 88 counts negative transitions in the wave form of FIG. 12 (84), and changes its output terminal "o" to "1" upon downward transition of the fourth pulse as shown by FIG. 12(88). Accordingly, the decoder 99 decodes and issues decoded output as shown in the Table 1 within the time period from the end of $T_2$ to the end of the fifth pulse. In this case, since both the output terminal "d" and "e" of the shift register 89 are "1" and "1" in the decoder 99, the output terminal "d" becomes "1" and the output terminals "e", "f" and "g" becomes "0".

The operation of the system has been elucidated in the above for the example that the selection switch 39 is closed. As is seen from the above description, by means of the selection signals consisting of the first to fourth pulse a desired controlling is selected, and then by means of the retaining signal consisting of the fifth pulse the action of the selected controlling can be made.

The operation is elucidated hereinafter taking an actual example. The receiver of FIG. 10 is provided in a television receiver set and the receiving transducer 77 is provided in front of the receiver set so as to receive the controlling signal of ultrasonic or light from the controlling transmitter of FIG. 9. The output terminal "d" of the decoder 99 is connected to a motor controlling means to rotate the motor linked to a sound volume controlling potentiometer to the direction to increase the sound volume, and the output terminal "e" of the decoder 99 is connected to the motor controlling means to rotate the motor to the direction to decrease the sound volume, the output terminal "f" of the decoder 99 is connected to a motor controlling means to rotate the motor linked to a color saturation controlling potentiometer to the direction to increase the color saturation, and the output terminal "g" of the decoder is connected to the motor controlling means to rotate the motor to decrease the color saturation. By means of the above-mentioned connection, when one of the selection switches for instance, the switch 39 is pressed, the controlling signal consisting of five bursts of $f_1$ frequency and four bursts of $f_2$ frequency parts with specified arrangement with each other, which corresponds to the switch 39, is transmitted, thereby to cause a selection signal to be issued from the output terminal "d" of the decoder 99. Subsequent to the abovementioned controlling signals of four $f_1$ part and four $f_2$ parts, the long retained $f_1$ frequency part as the retention signal is transmitted to continue until a releasing of pressing of the selection switch, for instance, 39. By controlling the pressing time periods of the selection switch buttons, the retention times of the outputs from the output terminals "d", "e", "f" and "g" of the decoder 99 can be desirably controlled. And therefore, angle of rotation of the potentiometer shafts on channel selector shaft can be desirably controlled. By means of such controlling system employing the retention signal, the controlling of the sound volume, color saturation etc., can be made continuously. If a simpler controlling is required, a time constant circuit may be added so that specified lengths of the retention signals are produced for every closings of the selection switches and hence making the motors to rotate by preset angles for every one closing of the selection switch.

The number of the selection switches as well as decoder output terminals should be increased if more items of controllings are necessary. For instance, by increasing the number of controllings, not only sound volume and color saturation, but also tone, tint, power source, brightness, contrast, horizontal and vertical synchronizations, channels, band, etc., can be controlled.

In the channel selection, either way of (1) providing the same number of selection switches with the channel to be selected but excluding the retention signal or (2) providing only one selection switch to select a signal to actuate channel selector motor and employing the abovementioned retention signal to control the angle of rotation of the channel selector may be used.

In actual example, the controlling means are not limited to motors to rotate potentiometers or channel selectors, but any kind of controlling means, for instance, known voltage dependent resistors, voltage dependent capacitors, etc., can be employed to constitute tuner, sound controller, color controller, etc.

If number of required controlling is more than four, 3-bit binary number or 4-bit binary number, etc., should be employed in coding the controlling signal.

The inverted bit data are used for the sake of accurate controlling even in the presence of noises, but in some cases, the inverted bit may be omitted to simplify the constitution of the system.

What is claimed is:

1. A remote control system including a transmitter and a receiver,
    said transmitter comprising a means for transmitting controlling signals corresponding to selected control functions, each of said controlling signals containing first frequency portions disposed in time sequences in accordance with a pulse code modulation, second frequency portions disposed to fill time spaces between parts of said first frequency, a last second frequency part disposed immediately to follow the coded first frequency part and a control retention signal part of the first frequency disposed after said last second frequency part, length of time of said retention signal part being controlled by means of a switch for controlling analog means; and
    said receiver comprising a means to decode said controlling signal to produce output signals corresponding to said selected items and a means to control said output signal in a manner to continue for the retention signal part.

2. A remote control system of claim 1, wherein said receiver comprises a first band-pass filter for said first frequency portion and a second band-pass filter for said second frequency portion, a first detector and a second detector for detecting outputs of said first and second band-pass filters, respectively, and a means for taking out logic AND signal of output of one of said detector and inverted output of the other detector.

3. A remote control system of claim 1, wherein the transmitter comprises:
    a clock pulse generator, inhibited responsive to an inhibit signal applied to a stopping terminal thereof;
    a binary counter, responsive to said clock pulse and issuing a set of output pulses from its output terminals;
    a logic gate matrix, connected to said output terminals of said binary counter, and issuing several kinds of pulse trains of different length from a set of output terminals;
    a set of selection switches which selectively connect the output terminal of said logic matrix to said stopping terminal of said clock pulse generator, so as to stop the issuing of said clock pulses at selected times; and
    an oscillator which oscillates in said first frequency when the voltage of said coded pulse train of said logic gate matrix is in one state and in said second frequency when the voltage of said coded pulse train of said logic gate matrix is in the other state.

4. A remote control system of claim 1, wherein said transmitter comprises a means for retaining issuing of said retention signal during a selecting state of a selection switch.

5. A remote controlling system of claim 1, wherein each period of said second frequency portion is shorter than said space period in which said second frequency portion is arranged and said second frequency portions are arranged in a manner immediately to follow the ends of said first frequency portions, respectively.

6. A remote controlling system of claim 5, wherein the transmitter comprises:
    a selection means having a specified number of selection switches;
    an encoder which issues a first output having a pulse train arranged responding to the switch selectively closed, and issues a second output which lasts during closing of said selection switch;
    an oscillator wherein oscillation frequency is controlled to be in said first frequency and in said second frequency when its first input terminal is in one state and in the other state, respectively, and the oscillation is controlled to oscillate and ceasing oscillation when its second input terminal for receiving said second output of said encoder is in one state and in the other state, respectively; and
    a pulse generating means which produces a pulse output having said shorter period than said space period upon the end of each pulse of said first output of said encoder and gives said pulse output to said first input terminal of said oscillator.

7. A remote control system including a transmitter and a receiver for controlling a plurality of functional systems,
    said transmitter comprising
    encoding means for generating a signal indicative of a code;
    oscillator means, responsive to said signal indicative of a code, for transmitting to said receiver a control signal with said code, said control signal comprising a first sequence of alternating bursts of said first frequency and said second frequency in accordance with said code, and a subsequent retention pulse of said first frequency immediately following the last burst of said second frequency; and means, cooperating with said encoding means and said oscillator means, for controlling the duration of said retention pulse; and said receiver comprises:

decoder means, responsive to said transmitted control signal, for generating a first output signal indicative of said code and a second output signal in accordance with the duration of said retention signal;

said decoder means second output signal being applied to a selected one of said functional systems in accordance with said decoder means first output signal.

* * * * *